(12) United States Patent
Shafi et al.

(10) Patent No.: US 11,430,888 B2
(45) Date of Patent: Aug. 30, 2022

(54) INTEGRATED ASSEMBLIES HAVING TRANSISTORS CONFIGURED FOR HIGH-VOLTAGE APPLICATIONS

(71) Applicant: Micron Technology, Inc., Boise, ID (US)

(72) Inventors: Zia A. Shafi, Boise, ID (US); Luca Laurin, Lissone (IT); Durga P. Panda, Boise, ID (US); Sara Vigano, Monza (IT)

(73) Assignee: Micron Technology, Inc., Boise, ID (US)

( * ) Notice: Subject to any disclaimer, the term of this patent is extended or adjusted under 35 U.S.C. 154(b) by 33 days.

(21) Appl. No.: 16/919,520

(22) Filed: Jul. 2, 2020

(65) Prior Publication Data

US 2022/0005950 A1 Jan. 6, 2022

(51) Int. Cl.
*H01L 29/18* (2006.01)
*H01L 29/78* (2006.01)
*H01L 27/092* (2006.01)
*H01L 21/8238* (2006.01)
*H01L 29/66* (2006.01)

(52) U.S. Cl.
CPC .. *H01L 29/7835* (2013.01); *H01L 21/823814* (2013.01); *H01L 21/823835* (2013.01); *H01L 21/823857* (2013.01); *H01L 27/092* (2013.01); *H01L 29/6659* (2013.01)

(58) Field of Classification Search
CPC ............. H01L 29/7831; H01L 29/7833; H01L 29/7835; H01L 29/7855; H01L 27/092
USPC .......................................................... 257/500
See application file for complete search history.

(56) References Cited

U.S. PATENT DOCUMENTS

| 10,700,193 | B2 | 6/2020 | Yoo |
| 2010/0102388 | A1 | 4/2010 | Levin |
| 2010/0322009 | A1 | 12/2010 | Shimane |

(Continued)

FOREIGN PATENT DOCUMENTS

| CN | 10351592 | 1/2014 |
| KR | 10-20110103736 | 9/2011 |

(Continued)

OTHER PUBLICATIONS

Alvarez, et al., "Lateral DMOS Transistor Optimized for High Voltage BIMOS Applications", IEEE 1983, United States, pp. 420-423.

(Continued)

*Primary Examiner* — Hoai V Pham
(74) *Attorney, Agent, or Firm* — Wells St. John P.S.

(57) ABSTRACT

Some embodiments include an integrated assembly having a first gate operatively adjacent a channel region, a first source/drain region on a first side of the channel region, and a second source/drain region on an opposing second side of the channel region. The first source/drain region is spaced from the channel region by an intervening region. The first and second source/drain regions are gatedly coupled to one another through the channel region. A second gate is adjacent a segment of the intervening region and is spaced from the first gate by an insulative region. A lightly-doped region extends across the intervening region and is under at least a portion of the first source/drain region. Some embodiments include methods of forming integrated assemblies.

34 Claims, 10 Drawing Sheets

(56) References Cited

U.S. PATENT DOCUMENTS

| | | |
|---|---|---|
| 2011/0220878 A1 | 9/2011 | Lee |
| 2012/0168869 A1* | 7/2012 | Hikida ............... H01L 29/4238 |
| | | 257/365 |
| 2017/0062406 A1 | 3/2017 | Ko |
| 2018/0082998 A1 | 3/2018 | Anderson |
| 2019/0019866 A1 | 1/2019 | Kim |

FOREIGN PATENT DOCUMENTS

| | | |
|---|---|---|
| KR | 10-20200050282 | 5/2020 |
| TW | 200415713 | 8/2004 |
| TW | 200741892 | 11/2007 |
| TW | 200945585 | 11/2009 |
| TW | 201931559 | 8/2019 |
| TW | 110124281 | 12/2021 |
| WO | WO PCT/US2021/039465 | 10/2021 |

OTHER PUBLICATIONS

Chen et al., "Molding Compounds for High Breakdown Voltage Applications on Power IC Semiconductors", Electronics Components and Technology Conference, 1997, United States, pp. 91-94.

* cited by examiner

INTEGRATED ASSEMBLIES HAVING TRANSISTORS CONFIGURED FOR HIGH-VOLTAGE APPLICATIONS

TECHNICAL FIELD

Integrated assemblies and methods of forming integrated assemblies.

BACKGROUND

Field-effect transistors (FETs) are commonly utilized as components of integrated assemblies. In some applications, it may be desirable for the transistors to be utilized in high-voltage applications (i.e., applications in which a large voltage differential may be provided between the drain and source of the transistor, with the voltage differential between the drain and source being abbreviated herein as $V_{DS}$). A traditional FET may have a breakdown voltage, $V_{Ds}$, which is too low to be suitable for high-voltage applications. Accordingly, the FETs may be modified to enhance suitability for high-voltage applications. One modification is to increase the distance between a drain of the FET and a gated channel region. However, it may be difficult to cost-effectively fabricate the modified FETs.

It is desired to develop new transistor architectures which may be suitable for high-voltage locations, and to develop methods for fabricating such transistor architectures.

DETAILED DESCRIPTION OF THE ILLUSTRATED EMBODIMENTS

Some embodiments include transistor configurations having a pair of source/drain regions gatedly coupled through a channel region. A primary gate structure is operably coupled with the channel region. At least one of the source/drain regions is spaced from the channel region by an intervening region having one or more secondary gate structures thereover. Such secondary gate structures may be "dummy" structures (i.e., may have no electrical purpose in a final assembly, and instead are utilized solely during fabrication of the transistor configurations to space one or both of the source/drain regions from the channel region). Alternatively, at least one of the secondary gate structures may be coupled to a reference voltage to hold said at least one secondary gate structure to a desired static reference voltage (e.g., VSS, VDD, VSS/2, etc.) during at least some operational modes of the transistor configurations. In yet other embodiments, at least one of the secondary gate structures may be coupled to driver circuitry (which may or may not be the same driver circuitry as is coupled to the primary gate structure), so that voltage along said at least one of the secondary gate structures may be tailored for particular operational modes of the transistor configurations.

Example embodiments are described as to FIGS. 1-11.

Figure 1:
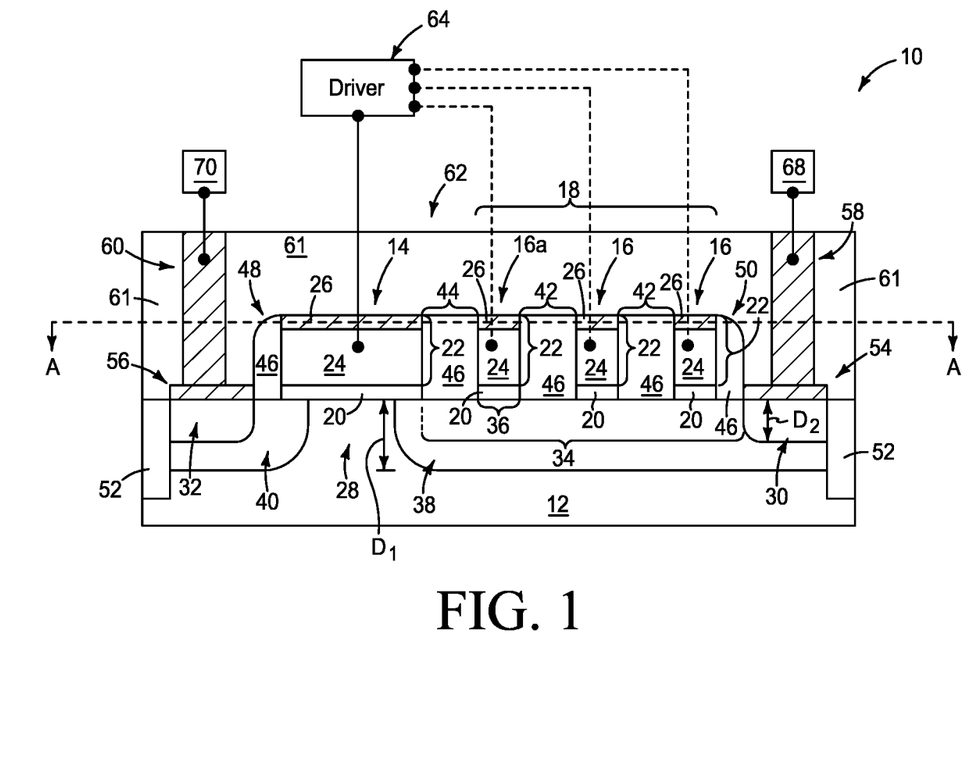
FIG. 1 is a diagrammatic cross-sectional side view of a region of an example integrated assembly comprising an example transistor.

Referring to FIG. 1, an example integrated assembly 10 is illustrated. The example assembly includes a semiconductor base 12. The semiconductor base 12 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor base 12 may comprise, consist essentially of, or consist of silicon (e.g., monocrystalline silicon).

A first gate (also referred to herein as a primary gate) 14 is over the semiconductor base 12, and second gates (also referred to herein as secondary gates) 16 are laterally adjacent the first gate 14. In the illustrated embodiment, there are three of the second gates 16. As will be discussed in more detail below, the second gates 16 are utilized, at least in part, to space a source/drain region from the primary gate 14 during the patterning of the source/drain region. There may be any suitable number of the second gates 16. For instance, some embodiments may include at least one of the second gates and no more than five of the second gates, some embodiments may include at least one of the second gates and no more than ten of the second gates, some embodiments may include more than 10 of the second gates, etc.

The second gates 16 together form a set 18, with such set being laterally offset from the first gate 14.

The gates 14 and 16 comprise insulative material 20, and conductive regions 22 over the insulative material 20. The conductive regions may comprise any suitable number of conductive materials, and in the shown embodiment comprise metal-containing material 26 over conductive gate material 24.

The insulative material 20 may be referred to as gate dielectric material, and may comprise any suitable composition(s). For instance, the insulative material 20 may comprise, consist essentially of, or consist of silicon dioxide.

The conductive gate material 24 may comprise any suitable electrically conductive composition(s). For instance, in some embodiments the conductive gate material may comprise conductively-doped semiconductor material (e.g., conductively-doped germanium, conductively-doped silicon, etc.). If the conductive gate material 24 comprises silicon, such silicon may be in any suitable crystalline form (e.g., one or more of polycrystalline, amorphous and monocrystalline).

The metal-containing material 26 may comprise any suitable composition(s). In some embodiments the metal-containing material 26 may be formed by reaction of metal with semiconductor material along an upper surface of the conductive gate material 24, and accordingly may comprise metal in combination with the semiconductor material of the conductive gate material. For instance, if the conductive gate material 24 comprises silicon, the metal-containing material 26 may comprise metal silicide (e.g., tungsten silicide, titanium silicide, tantalum silicide, etc.); if the conductive gate material 24 comprises germanium, the metal-containing material 26 may comprise metal germanide (e.g., tungsten germanide, titanium germanide, tantalum germanide, etc.), etc.

A channel region 28 is within the semiconductor base 12 and directly under the first gate 14. One source/drain region 30 is on one side of the channel region 28, and another source/drain region 32 is on another side of the channel region. One of the source/drain regions 30 and 32 may be referred to as a first source/drain region, and the other may be referred to as a second source/drain region. In some embodiments, the first source/drain region may be considered to be on a first side of the channel region 28, and the second source/drain region may be considered to be on a second side of the channel region 28, with the second side being in opposing relation to the first side. One of the source/drain regions 30 and 32 is a source and the other is a drain. In some embodiments, the source/drain region 30 may be referred to as a first source/drain region, and may correspond to the drain. In other embodiments, the source/drain region 30 may be referred to as a first source/drain region and may correspond to the source.

An intervening region 34 is between the primary gate 14 and the source/drain region 30. The second gates 16 are over the intervening region, with each of the second gates being adjacent a segment of the intervening region. For instance, one of the gates is labeled 16a, and such gate is adjacent a segment 36 of the intervening region 34.

A first lightly-doped region 38 is within the semiconductor base 12 and extends across the intervening region 34. The lightly-doped region may comprise a dopant concentration within a range of from about $1 \times 10^{17}$ atoms/cm$^3$ to about $5 \times 10^{18}$ atoms/cm$^3$. The dopant may be p-type (e.g., boron in applications in which the semiconductor base 12 comprises silicon) or n-type (e.g., phosphorus or arsenic in applications in which the semiconductor base 12 comprises silicon).

A second lightly-doped region 40 is along an opposing side of the channel region 28 relative to the first lightly-doped region 38. The second lightly-doped region 40 may comprise a same dopant to a same concentration as the first lightly-doped region 38, or may comprise a different dopant and/or a different dopant concentration than the first lightly-doped region 38.

The source/drain regions 30 and 32 are heavily-doped with dopant. Such heavy doping may include, for example, a dopant concentration in excess of about $10^{20}$ atoms/cm$^3$. The dopant within the source/drain regions 30 and 32 may be the same dopant type as the dopant within the lightly-doped regions 38 and 40, and accordingly the regions 38 and 40 may correspond to lightly-doped diffusion (LDD) regions.

The lightly-doped regions 38 and 40 are deeper than the source/drain regions 30 and 32, and extend at least partially under the source/drain regions 30 and 32. In the shown embodiment, the lightly-doped regions 38 and 40 extend entirely across bottom portions (bottom peripheries) of the heavily-doped source/drain regions 30 and 32.

The regions 38, 40, 30 and 32 may be formed to any suitable depths. In some embodiments, the regions 38 and 40 are formed to a first depth $D_1$ which is less than or equal to about 200 (nanometers) nm, and the regions 30 and 32 are formed to a second depth $D_2$ which is less than the first depth. The regions 38 and 40 may be formed to the same depth as one another (as shown) or may be formed to different depths relative to one another. Similarly, the regions 30 and 32 be formed to the same depth as one another (as shown), or may be formed to different depths relative to one another.

The second gates 16 are spaced from one another by insulative regions 42, and the second gate 16a is spaced from the primary gate 14 by an insulative region 44. Insulative material 46 is within the insulative regions 42 and 44. The insulative material 46 also forms a first sidewall spacer 48 along a sidewall of the primary gate 14, and forms a second sidewall spacer 50 along a sidewall of an outermost one of the secondary gates 16.

The insulative material 46 may comprise any suitable composition(s). For instance, the insulative material 46 may comprise, consist essentially of, or consist of one or both of silicon dioxide and silicon nitride.

Shallow trench isolation (STI) 52 is shown provided within the base 12 to define boundaries of the doped regions 38, 40, 30 and 32. The STI may comprise, consist essentially of, or consist of silicon dioxide.

In the illustrated embodiment, metal-containing regions 54 and 56 are provided over the source/drain regions 30 and 32. One of the metal-containing regions 54 and 56 may be referred to as a first metal-containing region, and the other may be referred to as a second metal-containing region. The metal-containing regions 54 and 56 may comprise any suitable composition(s). In some embodiments, the metal-containing regions 54 and 56 are formed by combining metal with semiconductor material of the base 12. For instance, if the base 12 comprises silicon, the metal-containing regions 54 and 56 may comprise, consist essentially of, or consist of metal silicide (e.g., titanium silicide, tungsten silicide, tantalum silicide, etc.).

Conductive interconnects 58 and 60 on shown to be electrically coupled with the source/drain regions 30 and 32 through the metal-containing regions 54 and 56. The conductive interconnects 58 and 60 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

An insulative material 61 is provided over the gates 14 and 16, and along sides of the interconnects 58 and 60. The insulative material 61 may comprise any suitable composition(s). For instance, the insulative material 61 may comprise, consist essentially of, or consist of silicon dioxide.

A transistor 62 includes the channel region 28, the source/drain regions 30 and 32, the lightly-doped regions 38 and 40, and the primary gate 14. The transistor may or may not also be considered to include the secondary gates 16. Driver circuitry (Driver) 64 is electrically coupled with the primary gate 14. The driver circuitry may be utilized to selectively provide voltage to the primary gate 14. The primary gate 14 may be considered to be operatively proximate (operatively adjacent) the channel region 28 such that an appropriate voltage (threshold voltage) on the primary gate 14 will induce an electric field within the channel region 28 to place the transistor 62 in a first operational mode in which the source/drain regions 30 and 32 are electrically coupled to one another through the channel region 28. If the voltage on the primary gate 14 is below the threshold voltage, the transistor 62 will be in a second operational mode in which the source/drain regions 30 and 32 are not electrically coupled to another. The selective transitioning between the first and second operational modes of the transistor (i.e., the selective coupling/decoupling of the source/drain regions 30 and 32 to/from one another) may be referred to as gated operation of the transistor 62, and accordingly the source/drain regions 30 and 32 may be considered to be gatedly coupled to one another through the primary gate 14. In some embodiments, the channel region 28 may be considered to shift between a first operational mode which couples the source/drain regions 30 and 32 to one another through the channel region, and a second operational mode in which the source/drain regions 30 and 32 are decoupled from one another.

Figure 1A:
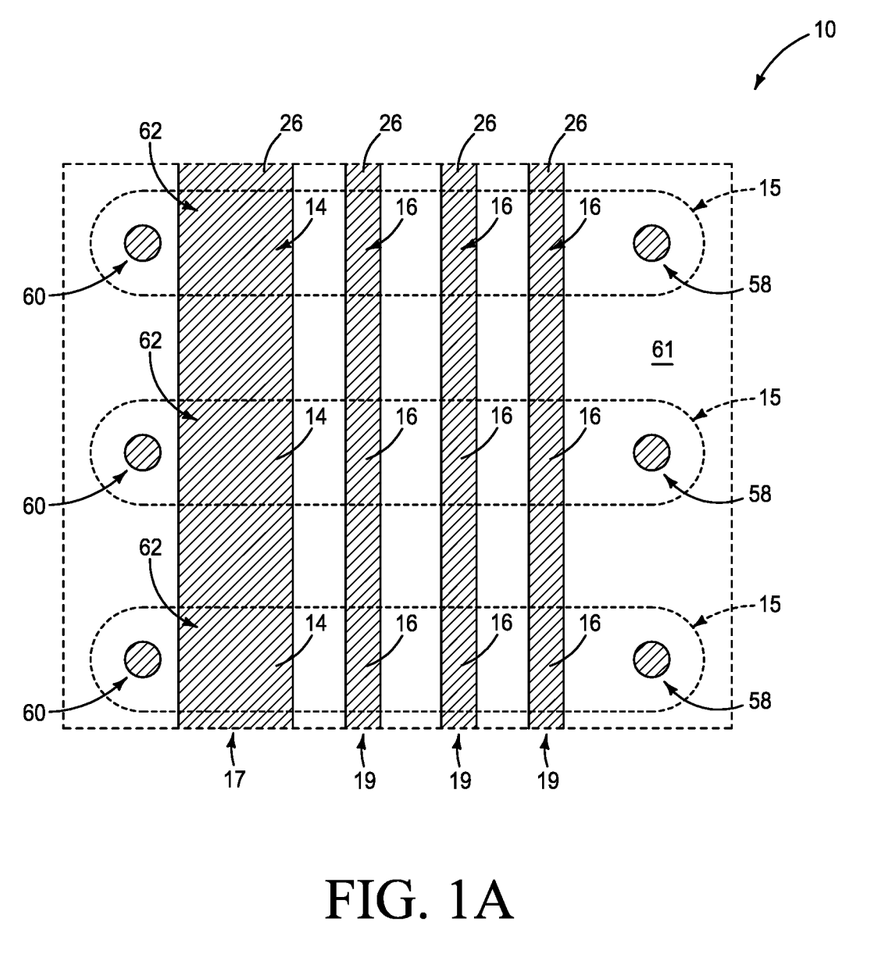
FIG. 1A is a diagrammatic top-down view along the line A-A of FIG. 1.
Figure 1B:
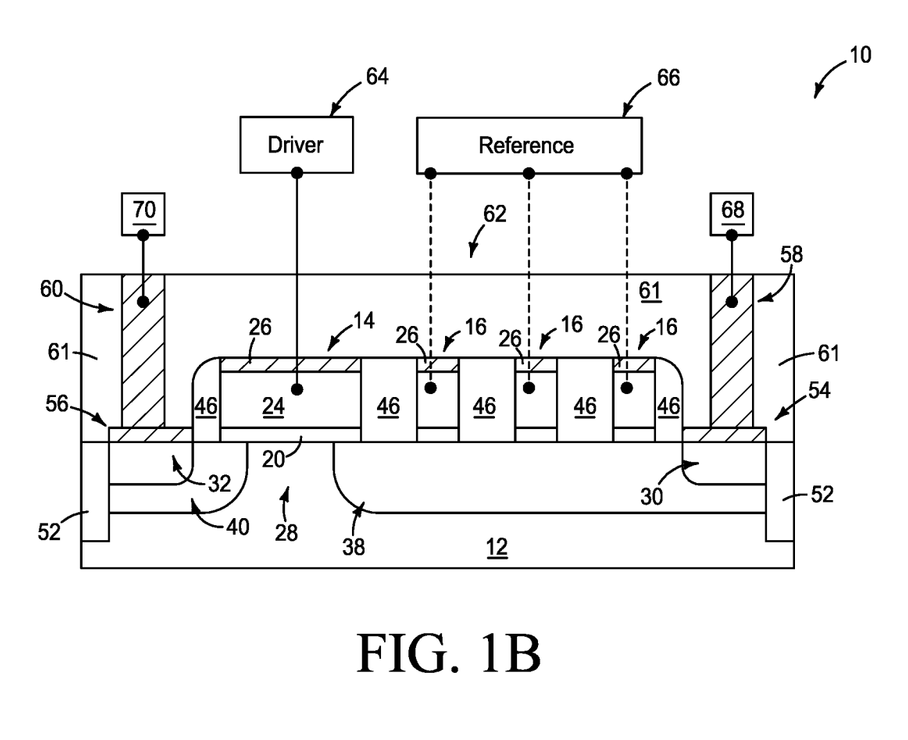
FIG. 1B is a diagrammatic cross-sectional side view of a region of an example integrated assembly comprising another example transistor.

The secondary gates 16 may or may not be electrically controlled during the operation of the transistor 62. FIG. 1 shows dashed lines between the driver circuitry 64 and the secondary gates 16 to indicate that the secondary gates may be optionally coupled with the driver circuitry 64. If one or more of the secondary gates 16 are coupled with the driver circuitry 64, then voltage may be optionally induced on said one or more of the secondary gates 16 during operation of the transistor 62 to enhance coupling of the source/drain regions 30 and 32. If the secondary gates 16 are not coupled with the driver circuitry 64, then the gates 16 may be electrically floating during all operational modes of the transistor 62. Alternatively, the secondary gates may be coupled with a suitable reference voltage source 66 as shown in FIG. 1B. The reference voltage source 66 may be maintained at any suitable voltage, including, for example, Vdd, Vss, Vdd/2, etc.

The conductive interconnects 58 and 60 of FIGS. 1 and 1B are shown to be coupled with circuit components 68 and 70, respectively. Such components may correspond to, for example, one or more of logic circuitry, driver circuitry, supply voltages, sensing circuitry, decoder circuitry, etc.

In some embodiments, the transistors 62 of FIGS. 1 and 1B may be PMOS transistors (i.e., the source/drain regions 30 and 32 may be p-type regions), and in some embodiments the transistors 62 of FIGS. 1 and 1B may be NMOS transistors (i.e., the source/drain regions 30 and 32 may be n-type regions). The PMOS transistors and/or NMOS transistors may be incorporated into CMOS configurations, as described in more detail below with reference to FIG. 11.

In some embodiments, the transistors 62 of FIGS. 1 and 1B may be high-voltage transistors (i.e., may be suitable for operation in applications in which a high-voltage differential is provided between the source/drain region 30 and the source/drain region 32). The transistors 62 may be configured to have high breakdown voltages, $V_{DS}$. For purposes of understanding this disclosure and the claims that follow, the breakdown voltage $V_{DS}$ refers to the voltage differential between the source/drain regions 30 and 32 that impairs performance of a transistor (i.e., that causes breakdown of junctions between the source/drain regions to impair controllable gated coupling of such source/drain regions). In some embodiments, the transistors 62 described herein may have breakdown voltages, $V_{DS}$, of at least about 15 volts (V), at least about 50 V, at least about 100 V, at least about 200 V, etc.

The transistor 62 of FIG. 1 may be one of many substantially identical transistors of an integrated assembly, with the term "substantially identical" meaning identical to within reasonable tolerances of fabrication and measurement. FIG. 1A is a top-down view along the line A-A of FIG. 1, and diagrammatically illustrates several active regions 15. The active regions 15 are shown in dashed-line (phantom) view in FIG. 1A to indicate that they are out of the plane of the cross-section of the figure. The active regions 15 may comprise the semiconductor material 12 of FIG. 1. The view of FIG. 1A shows that the primary gates 14 and the secondary gates 16 are along linear structures 17 and 19, respectively, that extend across the active regions 15. Transistors 62 are associated with each of the active regions 15, with the illustrated transistors 62 being substantially identical to one another.

The transistors 62 described above may be formed with any suitable processing. Example processing is described with reference to FIGS. 2-8.

Figure 2:
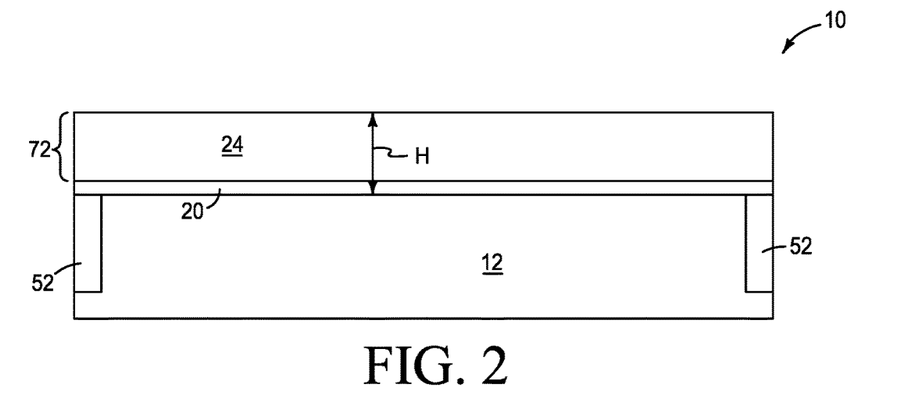
FIGS. 2-8 are diagrammatic cross-sectional side views of a region of an example assembly at example sequential process stages of an example method for forming an example transistor.

Referring to FIG. 2, a stack 72 is formed over the semiconductor-containing base 12 and the STI 52. The stack 72 comprises the conductive gate material 24 over the dielectric material 20. The stack 72 may be formed to any suitable height, H. For instance, the height may be within a range of from about 20 nm to about 200 nm.

Figure 3:
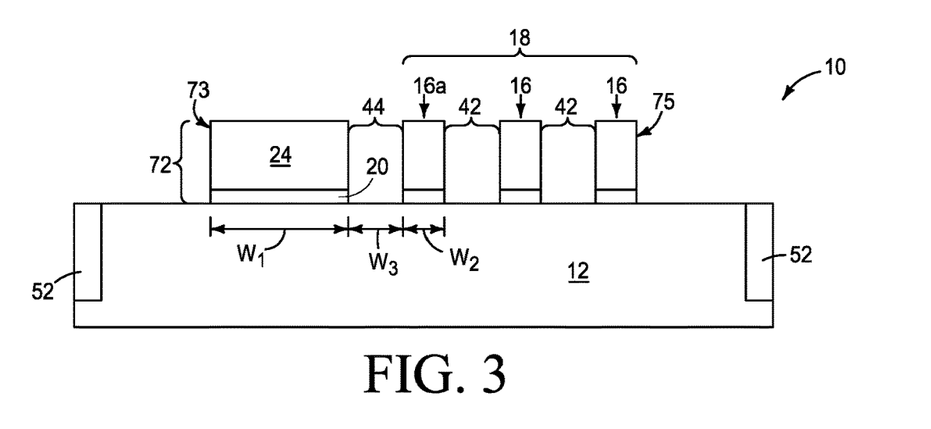

Referring to FIG. 3, the stack 72 is patterned into the first gate 14 and the set 18 of the second gates 16. One of the second gates 16 is labeled as 16a, and such second gate is neighboring to the first gate 14 (i.e., is a nearest of the second gates to the first gate). The intervening region 44 corresponds to a first gap between the primary gate 14 and the secondary gate 16a. The intervening regions 42 correspond to second gaps between the secondary gates 16. In some embodiments, there may be only one of the secondary gates 16, and accordingly there may be none of the second gaps 42.

The primary gate 14 may be considered to have a first outer sidewall 73 on an opposing side of the gate 14 from the gap 44, and the set 18 may be considered to have a second outer sidewall 75 on an opposing side of the set 18 from the gap 44.

The primary gate 14 has a first width $W_1$ along the cross-section of FIG. 3, and the secondary gates 16 have second widths $W_2$ along the cross-section of FIG. 3. In some embodiments, the first width $W_1$ (which may be considered to correspond to a gate length) may be within a range of from about 20 nm to about 200 nm, and the second widths $W_2$ may be within a range of from about 20 nm to about 200 nm. In some embodiments, the second widths $W_2$ may be less than or equal to about 80% of the first width $W_1$, less than or equal to about 60% of the first width $W_1$, less than or equal to about 50% of the first width $W_1$, less than or equal to about 30% of the first width $W_1$, etc. The secondary gates 16 may all have the same widths as one another, as shown. Alternatively, one or more of the secondary gates 16 may have a different width than at least one other of the secondary gates 16.

The gaps 42 and 44 may be the same width as one another, as shown, or not. Also, all of the gaps 44 may be the same width as one another, or at least one of the gaps 44 may have a different width than at least one other of the gaps 44.

In some embodiments, the gaps 42 and 44 may all have the same width, $W_3$, and such width may be less than or equal to about 80% of the first width $W_1$, less than or equal to about 60% of the first width $W_1$, less than or equal to about 50% of the first width $W_1$, less than or equal to about 30% of the first width $W_1$, etc.

Figure 4:
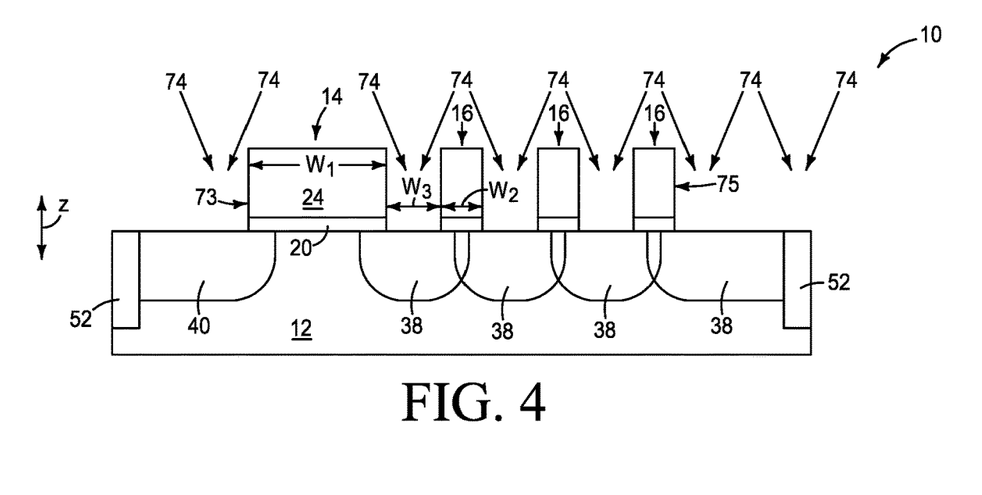

Referring to FIG. 4, dopant 74 is implanted into the base 12 to form the lightly-doped regions 38 and 40. The dopant is illustrated to be implanted at an angle so that the implant regions 38 and 40 extend partially under the first gate 14, and completely under the second gates 16. The heights and widths of the second gates 16 may be tailored, together with the angle and power of the implant 74, to achieve the desired goal of having the implant region 38 extend entirely under the secondary gates 16. In some embodiments, the implant 74 may be provided at an angle within a range of from about 20° to about 40° relative to an illustrated vertical z-axis.

Figure 5:
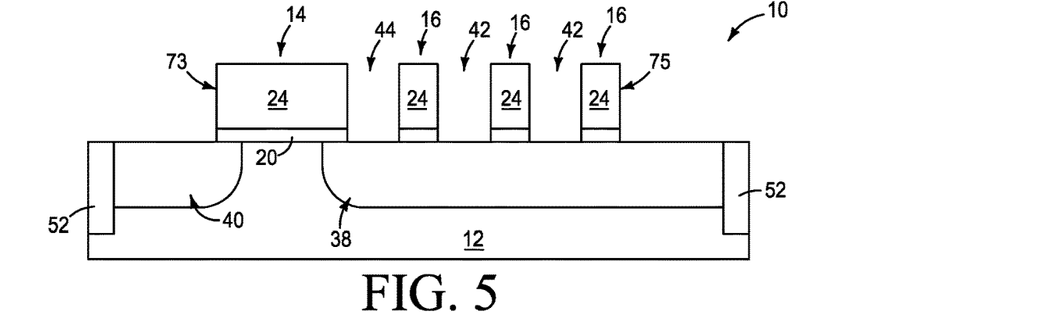

Referring to FIG. 5, the assembly 10 is shown at a process stage subsequent to the implant of FIG. 4, and the implant region 38 is shown to extend continuously under the secondary gates 16.

Figure 6:
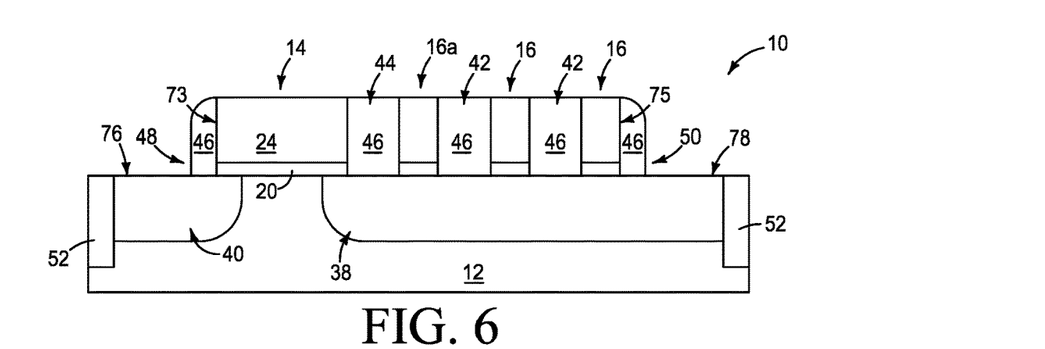

Referring to FIG. 6, the insulative material 46 is formed within the gaps 42 and 44 to fill such gaps, and is patterned into the spacers 48 and 50 along the outer sidewalls 73 and 75. In some embodiments, the insulative material 46 may be referred to as spacer material. The spacers 48 and 50 may be patterned from the spacer material 46 with suitable anisotropic etching.

After the spacer material 46 is patterned into the spacers 48 and 50, a first region 76 of the implant region 40 is exposed, with such first region 76 extending laterally outwardly of the spacer 48; and a second region 78 of the implant region 38 is exposed, with such second region extending laterally outwardly of the second spacer 50. In some embodiments, the regions 38 and 40 may be together referred to as a first implant region, and the regions 76 and 78 may be considered to be first and second exposed regions of the first implant region.

Figure 7:
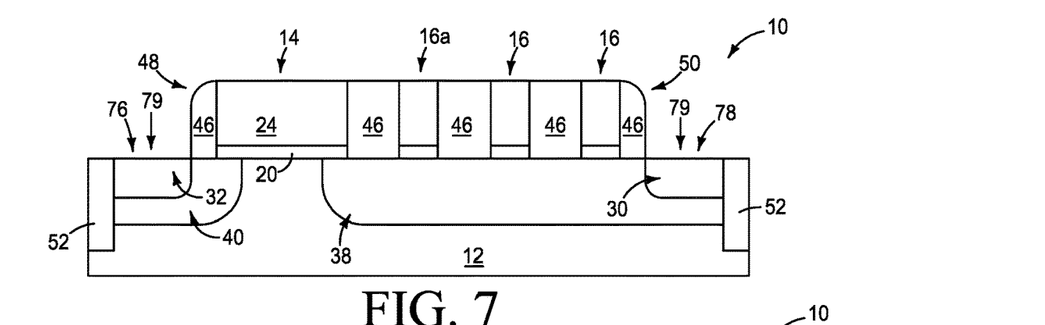

Referring to FIG. 7, second dopant 79 is implanted into the base 12 to form the source/drain implant regions 30 and 32. In some embodiments, the source/drain implant region 32 may be referred to as a first implant region formed within the first exposed region 76, and the source/drain implant region 30 may be referred to as a second implant region formed within the second exposed region 78.

The second dopant 79 may be a same dopant type as the first dopant 74 of FIG. 4 (e.g., both may be n-type or p-type), or may be a different dopant type relative to the first dopant. In some embodiments, the first and second dopants 74 and 79 may be the same as one another (e.g., both may comprise boron, phosphorus, arsenic, etc.).

The source/drain regions 30 and 32 are aligned to the spacers 48 and 50. In some embodiments, the insulative material 46 and the gates 16 may be considered to be utilized to offset the source/drain region 30 from the primary gate 14.

Figure 8:
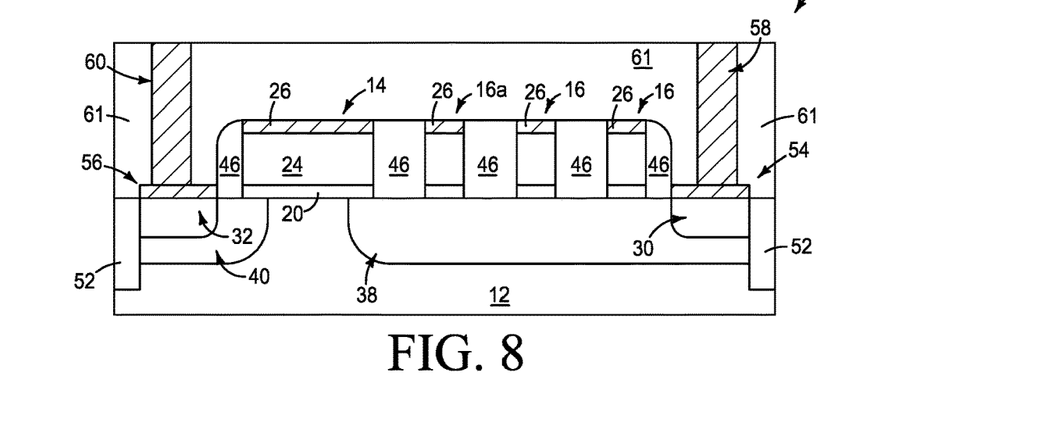

Referring to FIG. 8, the metal-containing regions 54 and 56 are formed over the source/drain implant regions 30 and 32. The metal-containing regions 54 and 56 may be formed by silicidation of silicon of the base 12.

The metal-containing material 26 is formed over the conductive gate material 24. In some embodiments, the metal-containing material 26 may comprise metal silicide formed by silicidation of silicon from the conductive gate material 24, and the material 26 may be formed at the same time as the materials 54 and 56.

The insulative material 61 is formed over the gates 14 and 16, and the conductive interconnects 58 and 60 are formed to be electrically coupled with the metal-containing materials 54 and 56.

The illustrated method of offsetting the source/drain region 30 from the primary gate 14 may be advantageous relative to conventional methods lacking the secondary gates 16 in that the illustrated method may simplify formation of the silicide 54/56 relative to methods lacking the protective materials 20, 24 and 46 over the intervening region 34 (FIG. 1) of the base to protect such region of the base from undesired silicidation. Also, the size and number of the secondary gates 16 may provide a tailorable parameter for adjusting the offset distance of the source/drain region 30. Additionally, the secondary gates 16 may provide useful operability characteristics of a final transistor 62 (FIGS. 1 and 1A) which would be lacking in conventional structures lacking such secondary gates.

The embodiments of FIGS. 1 and 1A show the secondary gates 16 provided between one of the source/drain regions 30 and the primary gate 14, and not between the other of the source/in regions 32 and the primary gate 14. In other words, the embodiments of FIGS. 1 and 1A show the secondary gates 16 provided between the drain region and the primary gate 14, or between the source region and the primary gate 14. In other embodiments, the secondary gates 16 may be provided between the source region and the primary gate 14 as well as between the drain region and the primary gate 14. Examples of such other embodiments are described with reference to FIGS. 9 and 10.

Figure 9:
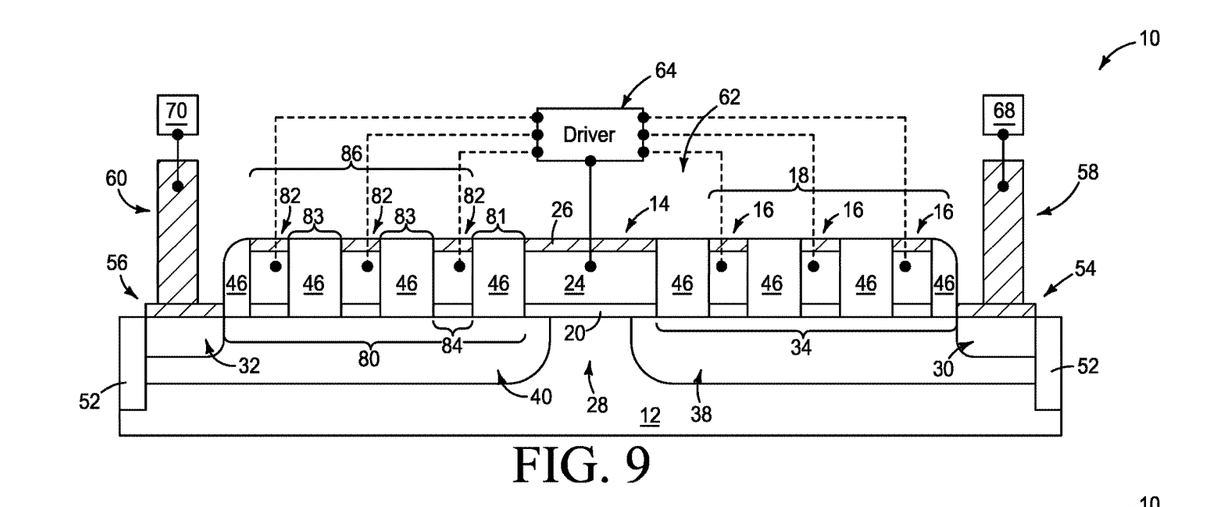
FIGS. 9, 9A, 10 and 10A are diagrammatic cross-sectional side views of regions of example integrated assemblies comprising example transistors.
Figure 10:
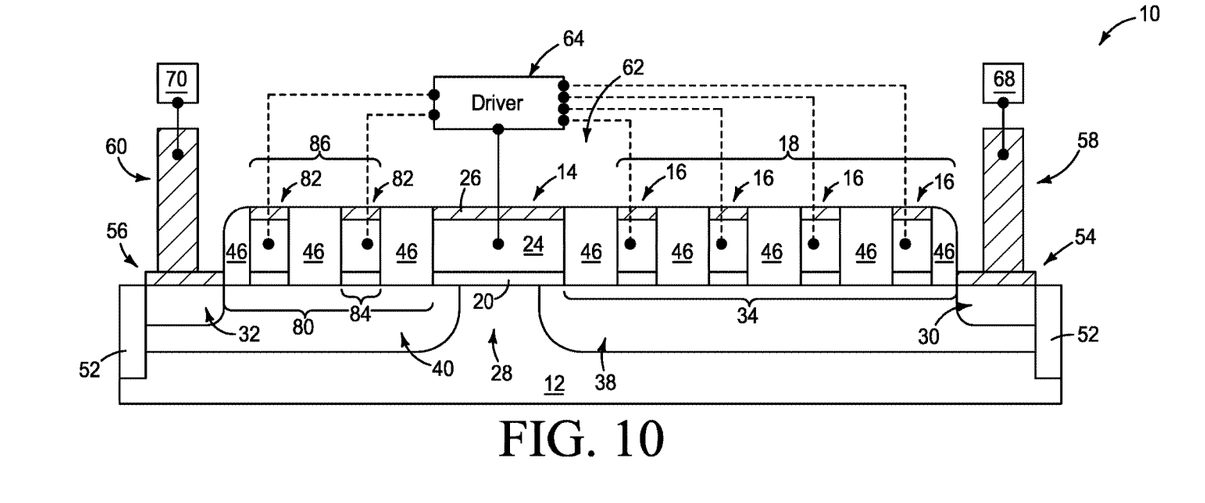

FIGS. 9 and 10 show the intervening region 34 as a first intervening region along one side (a first side) of the primary gate 14, and show a second intervening region 80 along the opposing second side of the primary gate 14. Secondary gates 82 are over the second intervening region 80, and are along segments of the second intervening region. For instance, one of the secondary gates 82 is shown to be along a segment 84 of the second intervening region 80. The secondary gates 82 may be referred to as third gates to distinguish them from the first gate 14 and the second gates 16.

There may be any suitable number of the third gates 82. In the illustrated embodiment, the third gates are within a set 86. The set 86 may comprise, for example, from one to five of the third gates 82, from one to ten of the third gates, more than 10 of the third gates, etc. In some embodiments, the number of third gates within the set 86 may be the same as the number of second gates within the set 18 so that the transistor 62 is symmetric between the source/drain regions 30 and 32 (as shown in FIG. 9), and in other embodiments the number of third gates within the set 86 may be different than the number of second gates within the set 18 so that the transistor 62 is asymmetric between the source/drain regions 30 and 32 (as shown in FIG. 10).

The third gates 82 are spaced from one another by intervening regions 83, and the third gate nearest the primary gate 14 is spaced from the primary gate 14 by an intervening region 81. The insulative material 46 is formed within the intervening regions 81 and 83.

The third gates 82 may be optionally coupled with the driver circuitry 64 as shown in FIGS. 9 and 10. If the third gates 82 are not coupled with the driver circuitry 64, the third gates 82 may be left to electrically float during operational modes of the transistors 62. If the third gates 82 are coupled with the driver circuitry 64, such driver circuitry may be utilized to modulate voltage along one or more of the third gates 82 during operation of the transistors 62.

Figure 9A:
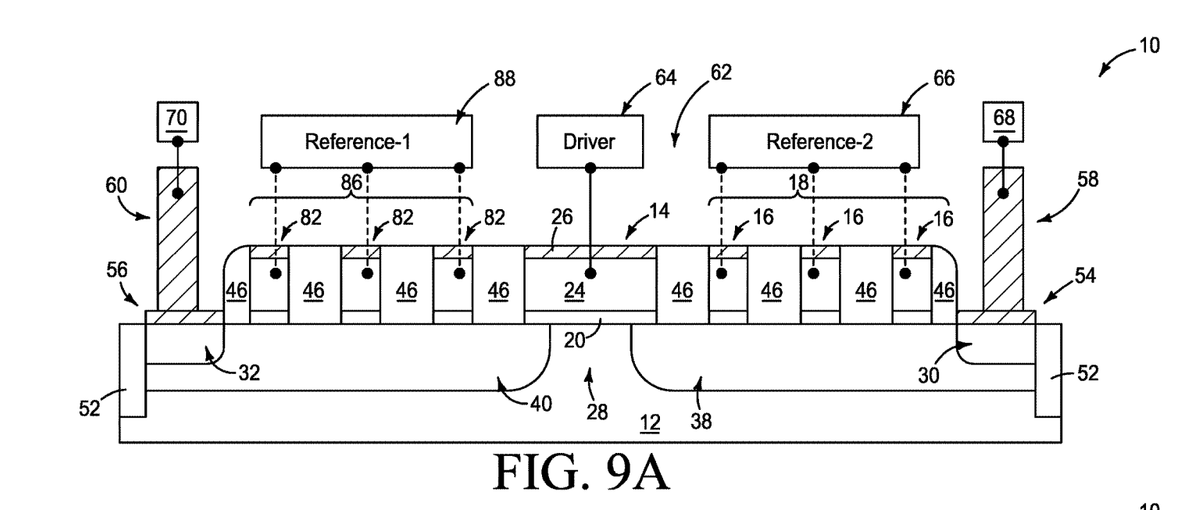
Figure 10A:
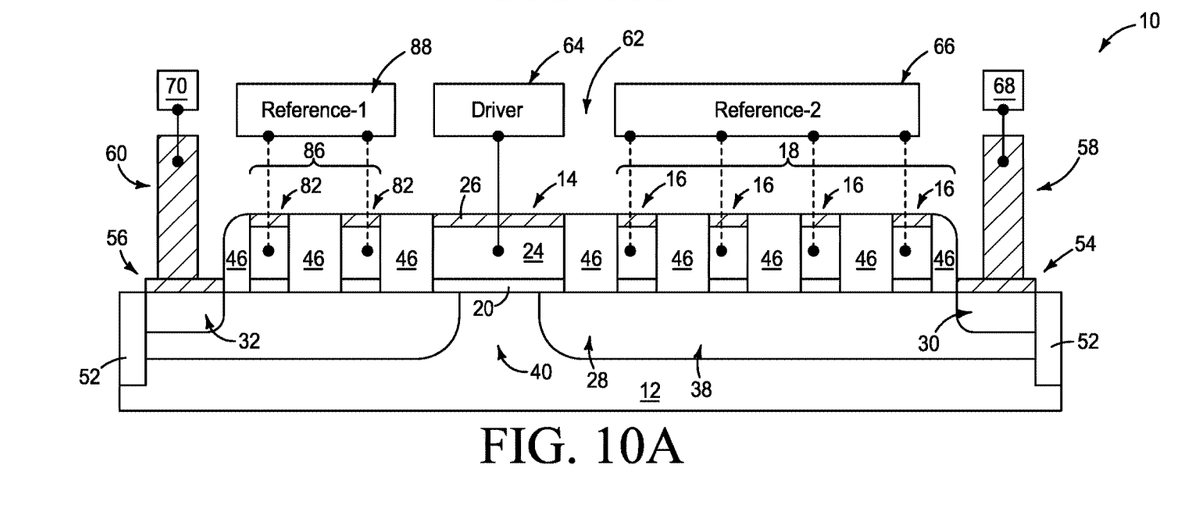

The third gates 82 may be coupled with reference circuitry 88 (Reference-1) as shown in FIGS. 9A and 10A. The reference circuitry 88 may correspond to a reference source voltage, and such may be the same or different than the reference source voltage 66 which is coupled with the second gates 16. FIGS. 9A and 10A show the reference source voltage 66 as Reference-2 while showing the reference circuitry 88 as Reference-1. It is to be understood that the reference source voltages 66 and 88 may be the same as one another, or may be different than one another.

The reference source voltages 66 and 88 may be utilized to hold the second and third gates 16 and 82 at static voltage levels during all operational modes of the transistors 62 (or alternatively considered, all operational modes of the channel regions 28).

Figure 11:
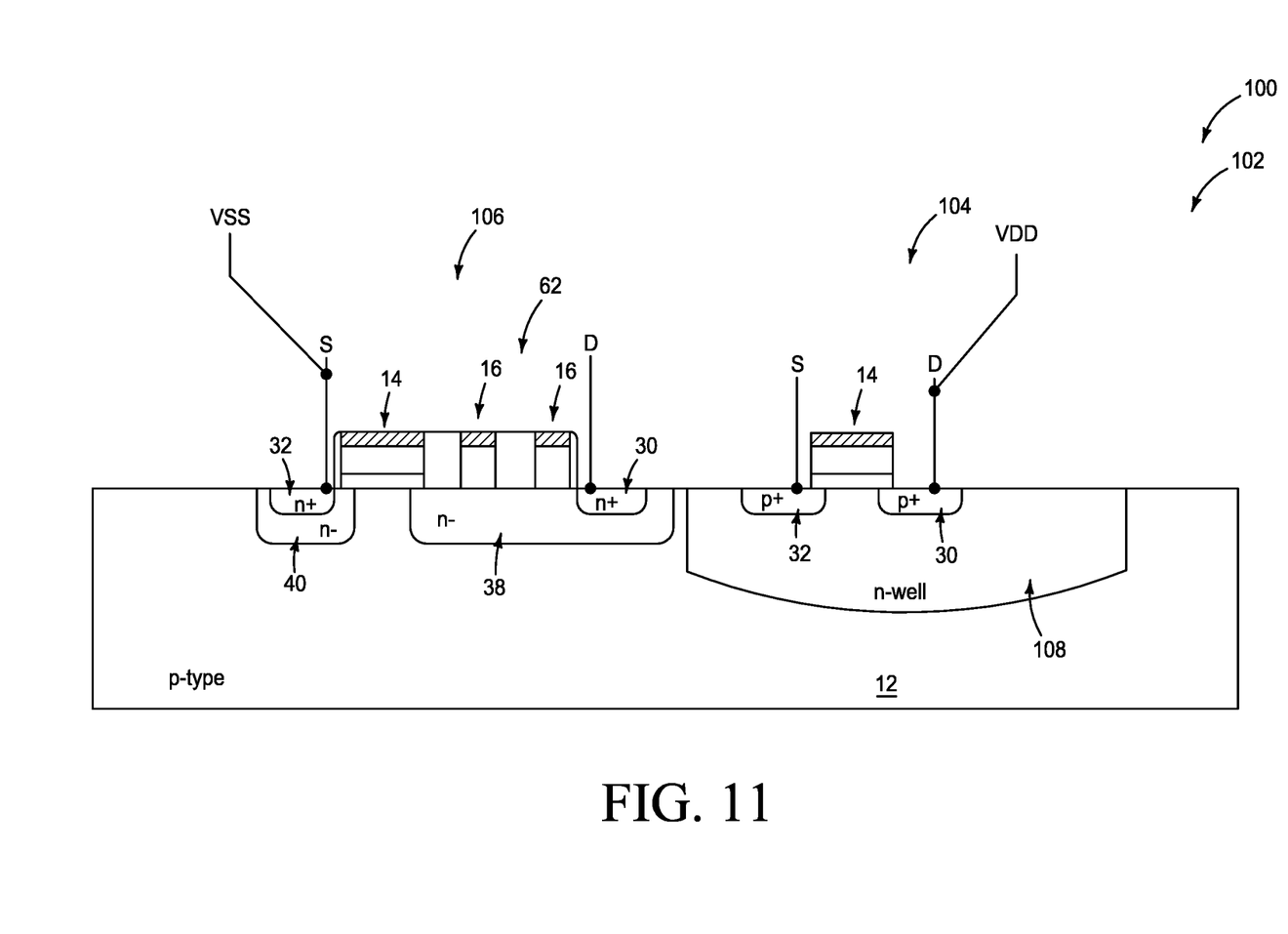
FIGS. 11, 11A and 11B are diagrammatic cross-sectional side views of regions of example integrated assemblies comprising example CMOS configurations.
Figure 11A:
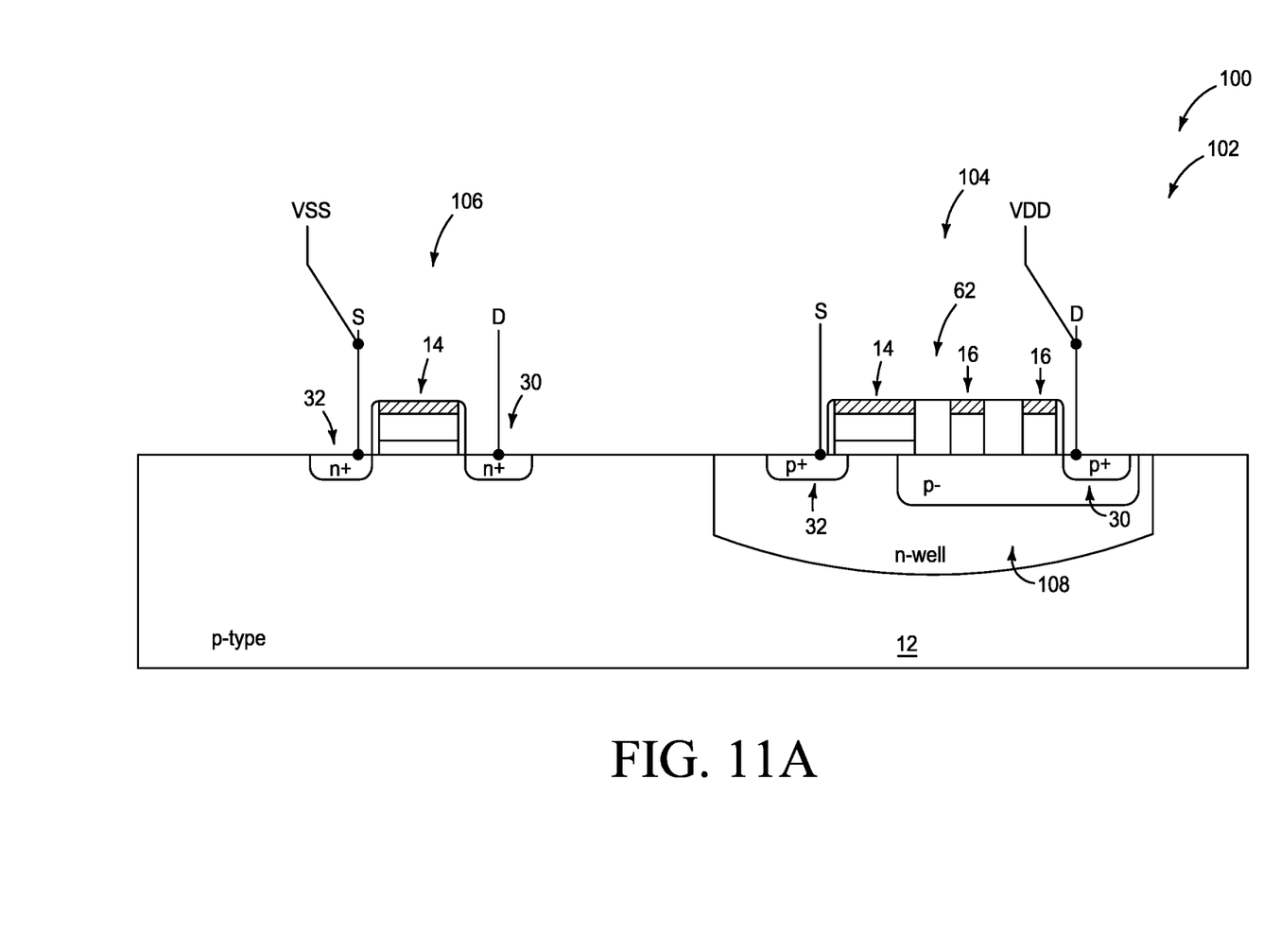
Figure 11B:
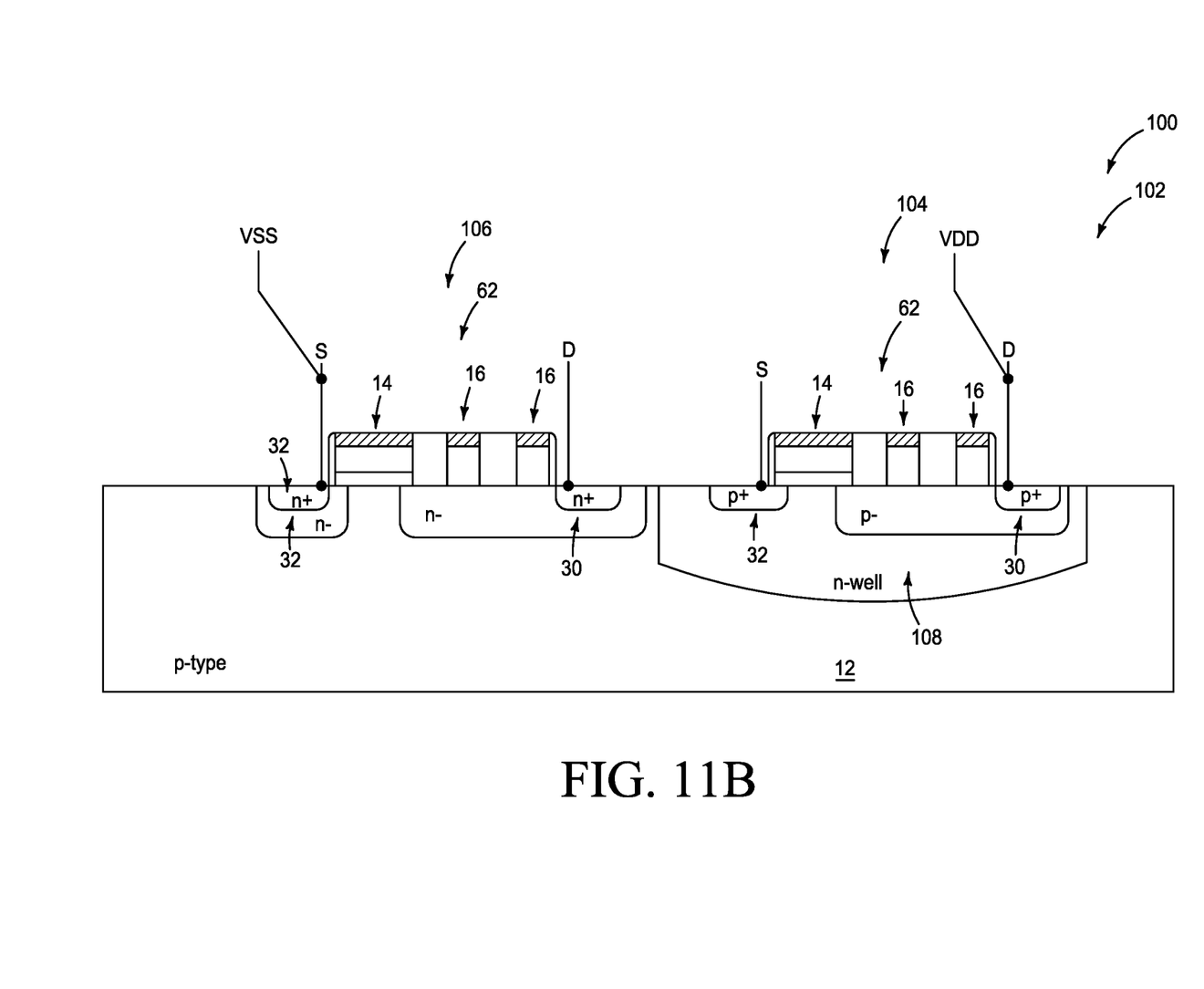

The transistors 62 described herein may be utilized in numerous applications. In some example applications, the transistors may be utilized in CMOS circuitry. FIGS. 11, 11A and 11B show example integrated assemblies 100 comprising example CMOS circuitry 102. The CMOS circuitries include a PMOS device 104 and an NMOS device 106. The PMOS devices are formed within n-wells 108, and the NMOS devices are formed within p-type regions of semiconductor bases 12.

The PMOS devices 104 comprise p+ source/drain regions 30 and 32, and the NMOS devices 106 comprise n+ source/drain regions 30 and 32 (with the source regions of the devices being labeled S and the drain regions of the devices being labeled D).

In the illustrated embodiments, the sources of the NMOS devices 106 are coupled with VSS, and the drains of the PMOS devices 104 are coupled with VDD; with VSS and VDD being example supply voltages.

The NMOS devices 106 of FIGS. 11 and 11B are shown to comprise high-voltage transistors 62 of the types described above, and the NMOS device 106 of FIG. 11A is shown to comprise a standard FET. The PMOS devices 104 of FIGS. 11A and 11B are shown to comprise high-voltage transistors 62 of the types described above, and the PMOS device 104 of FIG. 11 is shown to comprise a standard FET.

FIGS. 11, 11A and 11B show a few of many applications in which the transistors 62 may be incorporated into CMOS. For instance, FIGS. 11A and 11B show a "p−" region (LDD region) only under the drain regions 30 of the PMOS transistors. In other applications, another LDD region may be under the source regions 32 of the PMOS transistors. Also, the embodiments of FIGS. 11, 11A and 11B only show the second gates (additional gates) 16 on the drain sides of the example transistors. In other applications, at least some of the second gates 16 may be on the source sides of either or both of the PMOS transistors 104 and the NMOS transistors 106.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a first gate operatively adjacent a channel region, a first source/drain region on a first side of the channel region, and a second source/drain region on a second side of the channel region. The second side is in opposing relation to the first side. The first source/drain region is spaced from the channel region by an intervening region. The first and second source/drain regions are gatedly coupled to one another through the channel region. A second gate is adjacent a segment of the intervening region and is spaced from the first gate by an insulative region. A lightly-doped region extends across the intervening region and is under at least a portion of the first source/drain region.

Some embodiments include an integrated assembly comprising a semiconductor base, a first gate over the semiconductor base and operatively adjacent a channel region within the semiconductor base, and a first source/drain region within the semiconductor base and on a first side of the channel region. The first source/drain region is spaced from the channel region by an intervening region of the semiconductor base. A second source/drain region is within the semiconductor base and on a second side of the channel region in opposing relation to the first side of the channel region. A second gate is adjacent to a segment of the intervening region and is spaced from the first gate by an insulative region. A lightly-doped region extends across the intervening region and is under at least a portion of the first source/drain region. First and second metal-containing regions are over the first and second source/drain regions. First and second conductive interconnects are coupled with the first and second source/drain regions through at least the first and second metal-containing regions, respectively. A transistor comprises the channel region, the first and second source/drain regions, and the lightly-doped region.

Some embodiments include a method of forming an integrated assembly. A stack is formed over a semiconductor base. The stack comprises conductive gate material over dielectric material. The stack is patterned into a first gate and a set of one or more second gates. A first gap is between the first gate and a nearest second gate of said set. The first gate has a first outer sidewall on an opposing side of the first gate from the first gap. The set of one or more second gates has a second outer sidewall on an opposing side of the set from said first gap. If the set comprises more than one of the second gates, said second gates are spaced from one another by second gaps. A first dopant is implanted into the semiconductor base to form a first implant region within the semiconductor base. The first dopant is implanted at an angle such that the first implant region extends partially under the first gate, and completely under the one or more second gates of the set. Spacer material is formed along the first and second outer sidewalls to form a first spacer along the first outer sidewall and a second spacer along the second outer sidewall. The spacer material extends across the first gap, and extends across any second gaps. A first exposed region of the first implant region extends laterally outwardly of the first spacer, and a second exposed region of the first implant region extends laterally outwardly of the second spacer. A second dopant is implanted to form a first source/drain implant region within the first exposed region of the first implant region, and to form a second source/drain implant region within the second exposed region of the first implant region. First and second metal-containing regions are formed over the first and second source/drain implant regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   a first gate comprising a first side opposite a second side, the first gate operatively adjacent a channel region and coupled to a driver circuit;
   a first source/drain region on a first side of the channel region, and a second source/drain region on a second side of the channel region, with the second side being in opposing relation to the first side; the first source/drain region being spaced from the channel region by an intervening region; the first and second source/drain regions being gatedly coupled to one another through the channel region;
   a second gate adjacent a segment of the intervening region and spaced from the first side of the first gate by an insulative region, the second gate is coupled to the driver circuit;
   a third gate spaced from the second gate by an insulative region, the third gate is not coupled to the driver circuit;
   a lightly-doped region extending across the intervening region and being under at least a portion of the first source/drain region; and
   no gate exists spaced from the second side of the first gate.

2. The integrated assembly of claim 1 wherein the first source/drain region is a drain region.

3. The integrated assembly of claim 1 wherein the first source/drain region is a source region.

4. The integrated assembly of claim 1 wherein the channel region, the first and second source/drain regions and the lightly-doped region are within a semiconductor-containing base.

5. The integrated assembly of claim 4 wherein the semiconductor-containing base is a silicon-containing base.

6. The integrated assembly of claim 5 wherein the first and second source/drain regions are n-type regions within the silicon-containing base.

7. The integrated assembly of claim 5 wherein the first and second source/drain regions are p-type regions within the silicon-containing base.

8. The integrated assembly of claim 1 wherein the second gate is one of a plurality of second gates which are spaced apart from one another over segments of the intervening region.

9. The integrated assembly of claim 8 comprising 1-10 of the second gates.

10. The integrated assembly of claim 8 comprising 1-5 of the second gates.

11. The integrated assembly of claim 1 wherein the first gate is coupled with driver circuitry configured to selectively provide voltage to the first gate to selectively induce an electric field within the channel region and thereby selectively transition the channel region between a first operational mode that couples the first and second source/drain regions with one another and a second operational mode that does not couple the first and second source/drain regions with one another; and wherein the second gate is held at a static voltage level during all operational modes of the channel region.

12. The integrated assembly of claim 1 wherein the first gate is coupled with driver circuitry configured to selectively provide voltage to the first gate to selectively induce an electric field within the channel region and thereby selectively transition the channel region between a first operational mode that couples the first and second source/drain regions with one another and a second operational mode that does not couple the first and second source/drain regions with one another; and wherein the second gate electrically floats during all operational modes of the channel region.

13. The integrated assembly of claim 1 wherein the first gate is coupled with driver circuitry configured to selectively provide voltage to the first gate to selectively induce an electric field within the channel region and thereby selectively transition the channel region between a first operational mode that couples the first and second source/drain regions with one another and a second operational mode that does not couple the first and second source/drain regions with one another; and wherein the second gate is also coupled with the driver circuitry.

14. The integrated assembly of claim 1 wherein the first gate comprises germanium.

15. The integrated assembly of claim 1 wherein the second gate comprises germanium.

16. The integrated assembly of claim 1 wherein the first and second gates comprise germanium.

17. The integrated assembly of claim 1 further comprising a fourth gate spaced from the third gate by an insulative region.

18. The integrated assembly of claim 17 wherein the fourth gate is not coupled to the driver circuit.

19. The integrated assembly of claim 17 wherein the fourth gate is coupled to the driver circuit.

20. The integrated assembly of claim 1 further comprising a gate dielectric under the first gate and spaced from the second gate by the insulative region.

21. The integrated assembly of claim 1 further comprising a gate dielectric under the second gate and spaced from the first gate by the insulative region.

22. The integrated assembly of claim 1 further comprising:
- a gate dielectric under the first gate;
- a spacer against the second side of the first gate; and
- a metal-containing region over the second source/drain region and spaced from the gate dielectric by the spacer.

23. The integrated assembly of claim 1 further comprising:
- a first metal-containing region over the first gate; and
- a second metal-containing region over the second gate, the first metal-containing region spaced from the second metal-containing region by the insulative region.

24. An integrated assembly, comprising:
- a semiconductor base;
- a first gate over the semiconductor base and operatively adjacent a channel region within the semiconductor base the first gate is coupled to a driver circuit;
- a first source/drain region within the semiconductor base and on a first side of the channel region; the first source/drain region being spaced from the channel region by an intervening region of the semiconductor base;
- a second source/drain region within the semiconductor base and on a second side of the channel region in opposing relation to the first side of the channel region;
- a second gate adjacent a segment of the intervening region and spaced from the first gate by an insulative region the second gate is coupled to the driver circuit; a third gate spaced from the second gate by an insulative region, the third gate is not coupled to the driver circuit;
- a lightly-doped region extending across the intervening region and being under at least a portion of the first source/drain region;
- first and second metal-containing regions over the first and second source/drain regions;
- first and second conductive interconnects coupled with the first and second source/drain regions through at least the first and second metal-containing regions, respectively; and
- wherein a transistor comprises the channel region, the first and second source/drain regions, and the lightly-doped region.

25. The integrated assembly of claim 24 wherein the first source/drain region is a drain region.

26. The integrated assembly of claim 24 wherein the first source/drain region is a source region.

27. The integrated assembly of claim 24 wherein the second gate is one of a plurality of second gates which are spaced apart from one another over segments of the intervening region.

28. The integrated assembly of claim 24 wherein the first and second metal-containing regions comprise metal silicide.

29. The integrated assembly of claim 24 wherein the transistor has a breakdown voltage, $V_{DS}$, of at least about 15 volts.

30. The integrated assembly of claim 24 wherein the transistor has a breakdown voltage, $V_{DS}$, of at least about 50 volts.

31. The integrated assembly of claim 24 wherein the transistor has a breakdown voltage, $V_{DS}$, of at least about 100 volts.

32. The integrated assembly of claim 24 wherein the transistor has a breakdown voltage, $V_{DS}$, of at least about 200 volts.

33. The integrated assembly of claim 24 wherein the transistor is a PMOS transistor of a CMOS.

34. The integrated assembly of claim 24 wherein the transistor is an NMOS transistor of a CMOS.

* * * * *